(12) United States Patent
Quiquempoix et al.

(10) Patent No.: US 11,057,047 B2
(45) Date of Patent: Jul. 6, 2021

(54) RATIOMETRIC GAIN ERROR CALIBRATION SCHEMES FOR DELTA-SIGMA ADCS WITH CAPACITIVE GAIN INPUT STAGES

(71) Applicant: Microchip Technology Incorporated, Chandler, AZ (US)

(72) Inventors: Vincent Quiquempoix, Divonne-les-Bains (FR); Zeynep Sueda Turk, Zurich (CH)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 16/879,917

(22) Filed: May 21, 2020

(65) Prior Publication Data
US 2020/0373938 A1 Nov. 26, 2020

Related U.S. Application Data

(60) Provisional application No. 62/852,544, filed on May 24, 2019.

(51) Int. Cl.
*H03M 1/46* (2006.01)
*H03M 1/12* (2006.01)
*H03M 1/10* (2006.01)

(52) U.S. Cl.
CPC ......... *H03M 1/466* (2013.01); *H03M 1/1014* (2013.01); *H03M 1/1245* (2013.01); *H03M 1/462* (2013.01)

(58) Field of Classification Search
CPC .... H03M 1/466; H03M 1/1245; H03M 1/462; H03M 1/1014
See application file for complete search history.

(56) References Cited

U.S. PATENT DOCUMENTS

| | | | |
|---|---|---|---|
| 5,745,060 A | 4/1998 | Mccartney et al. | 341/120 |
| 6,509,852 B1 * | 1/2003 | Todsen | H03M 3/382 341/118 |
| 7,102,558 B2 | 9/2006 | Deval | 341/150 |
| 8,223,053 B2 | 7/2012 | Deval et al. | 341/143 |
| 9,325,336 B2 * | 4/2016 | Mulder | H03M 1/1014 |
| 10,218,377 B2 * | 2/2019 | Bogner | H03M 1/468 |
| 10,826,516 B2 * | 11/2020 | Lee | H03M 1/1014 |

OTHER PUBLICATIONS

International Search Report and Written Opinion, Application No. PCT/US2020/034131, 12 pages, dated Sep. 2, 2020.

* cited by examiner

*Primary Examiner* — Brian K Young
(74) *Attorney, Agent, or Firm* — Slayden Grubert Beard PLLC (57) ABSTRACT

An analog to digital converter (ADC) circuit includes voltage and reference input terminals, a sample circuit, and control logic. The sample circuit includes input and output terminals, and capacitors connected in parallel and arranged between the input and output terminals. The control logic is configured to, in a calibration phase of operation, cause the multiplexer to route the ADC reference input terminal to the sampling voltage input terminal, determine a given gain value, determine a set of the capacitors to be used to achieve the given gain value, successively enable capacitor subsets to sample voltage of the reference input while disabling a remainder of the capacitors until all capacitors have been enabled, determine a resulting output code, and from the output code, determine a gain error of the given gain value of the ADC circuit.

17 Claims, 6 Drawing Sheets

RATIOMETRIC GAIN ERROR CALIBRATION SCHEMES FOR DELTA-SIGMA ADCS WITH CAPACITIVE GAIN INPUT STAGES

RELATED APPLICATIONS

The present application claims priority to U.S. Provisional Patent Application No. 62/852,544 filed May 24, 2019, the contents of which are hereby incorporated in their entirety.

TECHNICAL FIELD

The present disclosure relates to analog to digital converters (ADC) and, more particularly, to ratiometric gain error calibration schemes for delta-sigma ADCs with capacitive gain input stages.

BACKGROUND

Analog-to-digital converters are used in electronics for consumers, industrial applications, etc. Typically, analog-to-digital converters include circuitry for receiving an analog input signal and outputting a digital value proportional to the analog input signal. This digital output value is typically in the form of either a parallel word or a serial digital bit string. There are many types of analog-to-digital conversion schemes such as voltage-to-frequency conversion, charge redistribution, delta modulation, as well as others. Typically, each of these conversion schemes has its advantages and disadvantages. One type of analog-to-digital converter that has seen increasing use is the switched capacitor delta-sigma converter.

The input stage of the ADC may be accomplished using a switched-capacitor sample circuit for both input and reference voltages. The gain of the input stage may then be determined by the ratio between the input sampling capacitor and the reference sampling capacitor or a pair of capacitors for a fully differential structure. The gain of the input stage of the ADC may be used to more closely match input of the ADC to a range over which the ADC is configured to convert analog signals into digital signals. For example, if an ADC has a range of zero to two volts, but the expected ADC input is only going to be within the range of zero to one volts, the ADC may apply a gain of two to its input so that the possible values of the ADC input will match the ADC range.

Use of gains in the input stage of the ADC may introduce gain error. Testing for gain error may use a known, accurate reference or source voltage. The accurate reference or source voltage may be equal to a voltage of the ADC divided by the gain of the ADC. However, when ADCs are deployed in use in a variety of electronic devices, such electronic devices might not include or have access to an accurate reference or source voltage. Thus, self-test for such ADCs might not be possible or might not be practical. Moreover, testing an ADC may require testing each gain permutation or combination of capacitive gains in the input stages. Accordingly, testing such an ADC may be very slow, as each gain setting must be tested and may have a long settling time. Inventors of embodiments of the present disclosure have discovered systems and methods for testing ADCs that address one or more of these challenges.

SUMMARY

Embodiments of the present disclosure may include an ADC circuit. The ADC circuit may include an ADC voltage input terminal, an ADC reference input terminal, and a sample circuit. The sample circuit may include a sampling voltage input terminal, a sampling voltage output terminal, and capacitors connected in parallel and configured to be selectively enabled or disabled. The capacitors may be arranged between the sampling voltage input terminal and the sampling voltage output terminal. The ADC may include a multiplexer connected between the ADC voltage input terminal and the sampling voltage input terminal and between the ADC reference input terminal and the sampling voltage input terminal. The ADC may include control logic configured to, in a calibration phase of operation, cause the multiplexer to route the ADC reference input terminal to the sampling voltage input terminal, determine a given gain value of the ADC circuit for which gain error is to be calibrated, determine a set of the capacitors to be used to achieve the given gain value, successively enable capacitor subsets of the set of the plurality of capacitors to sample voltage of the ADC reference input terminal at the sampling voltage input terminal while disabling a remainder of the capacitors of the set of the capacitors until all capacitors of the set of the plurality of capacitors have been enabled, determine an output code resulting after enabling all capacitors of the set of the plurality of capacitors, determine a gain error of the given gain value of the ADC circuit from the output code, and take corrective action based upon the gain error of the given gain value of the ADC circuit.

Embodiments of the present disclosure may include a system. The system may include a reference voltage source connected to an ADC reference input terminal of an ADC circuit, and an ADC circuit of any of the above embodiments.

Embodiments of the present disclosure may include methods performed by any of the systems or ADCs of the above embodiments.

DETAILED DESCRIPTION

Embodiments of the present disclosure include an ADC circuit. The ADC circuit may be included within any larger electronic device. The ADC circuit may include an ADC voltage input terminal. With the ADC voltage input terminal, the ADC circuit may be configured to receive voltages for which an analog to digital conversion is to be performed in a normal phase of operation. The ADC circuit may include an ADC reference input terminal. With the ADC reference input terminal, the ADC circuit may be configured to receive reference voltages defining a range for the voltages for which an analog to digital conversion is to be performed. The ADC circuit may include a sample circuit. The sample circuit may be configured to sample inputs routed to it. The sample circuit may include a sampling voltage input terminal and a sampling voltage output terminal. Furthermore, the sample circuit may include capacitors connected in parallel and configured to be selectively enabled or disabled. The number of capacitors enabled may define a gain of the sample circuit and thus the ADC. The capacitors may be arranged between the sampling voltage input terminal and the sampling voltage output terminal. The ADC circuit may include a multiplexer connected between the ADC voltage input terminal and the sampling voltage input terminal, and between the ADC reference input terminal and the sampling voltage input terminal. The ADC circuit may include an integration circuit such as a delta-sigma analog loop circuit to accumulate values sampled by the sample circuit and produce the output code. The ADC circuit may include control logic. The control logic may be configured to, in a calibration phase of operation, cause the multiplexer to route the ADC reference input terminal to the sampling voltage input terminal, and to determine a given gain value of the ADC circuit for which gain error is to be calibrated. The control logic may be configured to, in the calibration phase of operation, determine a set of the capacitors in the sample circuit to be used to achieve the given gain value, and successively enable capacitor subsets of the set of the capacitors to sample voltage of the ADC reference input terminal at the sampling voltage input terminal while disabling a remainder of the capacitors of the set of the capacitors until all capacitors of the set of the capacitors have been enabled. The control logic may be configured to, in the calibration phase of operation, determine an output code resulting after enabling all capacitors of the set of the capacitors. The control logic may be configured to, in the calibration phase of operation, from the output code, determine a gain error of the given gain value of the ADC circuit. The control logic may be further configured to take corrective action based upon the gain error of the given gain value of the ADC circuit. The corrective action may include, for example, alerting a user of the ADC circuit, adjusting input ranges of the ADC circuit, or adjusting outputs of the ADC circuit.

In combination with any of the above embodiments, enabling each subset of the set of the capacitors may be configured to set the ADC circuit to perform a gain of one.

In combination with any of the above embodiments, the given gain value of the ADC circuit may be a multiple of two.

In combination with any of the above embodiments, each subset of the set of the capacitors may be enabled for a same number of samples.

In combination with any of the above embodiments, the control logic may be further configured to, in the calibration phase of operation, determine another gain value of the ADC circuit for which gain error is to be calibrated, determine another set of the capacitors in the sample circuit to be used to achieve the other gain value, successively enable capacitor subsets of the other set of the capacitors to sample voltage of the ADC reference input terminal at the sampling voltage input terminal while disabling a remainder of the capacitors of the other set of the capacitors until all capacitors of the other set of the capacitors have been enabled, determine an output code resulting after enabling all capacitors of the other set of the plurality of capacitors, and, from the output code, determine a gain error of the other gain value of the ADC circuit. This may be repeated for any suitable gain value of the ADC circuit.

In combination with any of the above embodiments, the control logic may be further configured to cause sampling of voltage of the ADC reference input terminal at the sampling voltage input terminal for a given number of samples, and cause sampling of each subset of the set of the plurality of capacitors for a subset of the given number of samples, wherein the subset of the given number of samples may be equal to the given number of samples divided by the given gain value.

In combination with any of the above embodiments, a quotient of the given number of samples divided by the given gain value has no remainders.

Figure 1:
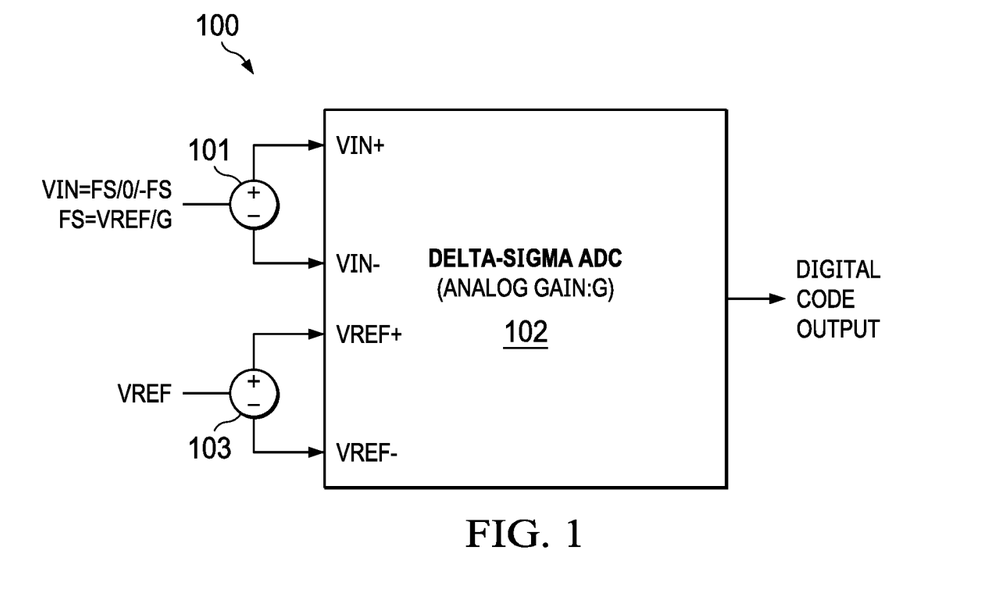
FIG. 1 is an illustration of an example system for gain error calibration for ADCs, according to some implementations.

FIG. 1 is an illustration of an example system 100 for gain error calibration for ADCs, according to some implementations. System 100 may include an ADC 102. ADC 102 may be a delta-sigma ADC. System 100 may be configured to determine gain errors in ADC 102.

ADC 102 may be configured to convert an analog input signal into a digital output code. The analog input signal may be single-ended (not shown, in which case a voltage is accepted as input and the received voltage is compared to ground) or differential, as shown in FIG. 1. The differential analog input may be the difference in voltage between the VIN+ and VIN− terminals of ADC 102, resulting in a total of VIN (VIN=VIN+−VIN−). ADC 102 may be configured to receive a reference voltage. The reference voltage may be single-ended (not shown, in which case a voltage is accepted as reference and the received reference voltage is compared to ground) or differential, as-shown in FIG. 1. The differential analog input may be the difference in voltage between VREF+ and VREF− terminals of ADC 102, resulting in a total of VREF given by $VREF=VREF+-VREF-$ These differential voltages may be attached to a certain common-mode, which is not depicted in the figure. The output code may then be a value proportional to VIN/VREF. The ADC code may be given as $ADC\ code=K*VIN/VREF$ wherein K is a constant.

ADC 102 may have an analog gain denoted as G. This analog gain, G, amplifies the input signal VIN internally in ADC 102 so that the voltage converted by ADC 102 is actually G times VIN. In such a case, the transfer function of ADC 102 becomes $ADC\ code=G*K*VIN/VREF.$ VREF may define the range of voltage input that can be converted by ADC 102. For a single-ended converter, the input voltage range applicable for the A/D conversion may then be the range [0, VREF]. For a fully-differential converter the input voltage range applicable for the A/D conversion may be the range [−VREF, +VREF]. When a gain G is applied, the input voltage range of ADC 102 is still the same, but is applied to G*VIN, so that effectively the input voltage range becomes the range [0, VREF/G] for a single-ended converter and the range [−VREF/G, +VREF/G] for a fully-differential converter. Outside of this range, the A/D conversions may suffer larger inaccuracies, output code may clip, and overall linearity of the converter may no longer be guaranteed.

ADC 102 may be configured to realize the analog gain, G, by various methods, but the actual transfer function performance of ADC 102 might not be exactly equal to the expected or ideal transfer function performance due to physical implementation limitations such as mismatches between analog components in ADC 102. Thus, system 100 may cause the gain to be measured and compensated for in ADC 102 to more closely approximate the desired or ideal transfer function (G*K*VIN/VREF). The error caused while implementing the gain of the transfer function is called the gain error of the ADC. The ADC transfer function may then be equal to G*K'*VIN/VREF where (K'/K−1) is the gain error at the gain G. Inventors of embodiments of the present disclosure have discovered that the gain error may vary and depend on the gain G, in addition to other parameters like temperature or power supply voltage. The gain error is the error on the slope of the linear transfer function of ADC 102. Other errors can occur and be characterized, wherein such errors occur in addition to the gain error. Such other errors may include offset errors, integral nonlinearity errors, and differential nonlinearity errors. These other errors may be independent of gain error and may be addressed separately.

In order to measure the gain (and therefore evaluate the gain error) of ADC 102, two measurements are performed. From these two measurements, the straight-line equation of the intersection of these data points may be extracted and the slope of the line determined. If these two points are further apart, the inaccuracies due to the measurements will become less important and may be negligible if the inaccuracy of the measurement is small compared to the voltage measured. Typically, these two measurements are made with inputs of 0 voltage and full-scale voltage range (FS) for a single-ended converter and a negative full-scale (−FS) and positive full-scale (+FS) for a fully-differential converter. A full-scale signal may include the extremity of the input voltage range. In order to maximize the accuracy of the gain error measurement, the system is generally measured with VIN set to zero and VIN set to FS which is (REF/G) for a single-ended converter and VIN− is set to negative FS which is (−VREF/G) and VIN+ is set to FS which is (VREF/G) for a fully-differential converter). This is depicted in FIG. 1 as VIN input of ADC 102 is connected to a voltage source 101 applying −FS, 0, or +FS values. Meanwhile, VREF input of ADC 102 is connected to a voltage source 103 whose value is constant and equal to VREF.

A zero measurement may measure an offset of ADC 102. To measure an offset, zero volts may be applied at the VIN input of ADC 102 and the output of ADC 102 observed. The zero measurement may be implemented by shorting the VIN+ and VIN− inputs together, causing VIN=0 at the VIN inputs of ADC 102. This may be performed internally in ADC 102. However, it may be more difficult to generate the FS signal accurately, wherein the full input range of ADC 102 is used by a voltage input. When G=1, generating VIN with the VREF voltage may be generated through input switches that would multiplex VREF inputs and VIN inputs. However, if G is different than 1, the FS signal cannot be generated easily as it is not a simple copy of an existing voltage, such as 0 volts by shorting VIN+ and VIN−, or VREF by connecting to VREF+ and VREF− terminals. The FS=VREF/G input voltage is often generated through another voltage source or through a DAC that would use the reference voltage as the reference element. However, inventors of the present disclosure have discovered that such a FS signal may then suffer inaccuracies due to the total unadjusted error of the DAC or the inaccuracy of the reference voltage. The inaccuracy of the reference voltage may directly result in an additional source of error in the gain measurement of ADC 102, and, in some cases, may even be the dominant source of error in performance of ADC 102. Moreover, the added DAC or voltage source to generate such a reference voltage may increase the total system cost of system 100. In addition, the added DAC or voltage source to generate such a reference voltage might not be efficiently applied to ADC 102 during operation of system 100 so as to measure the gain error. In addition, a different voltage is to be generated for each new value of G that is to be tested, as a given ADC may include many different gain settings. Settling times necessary for creation of each such reference voltage may delay evaluation of ADC 102.

Therefore, inventors of embodiments of the present disclosure have discovered that a system that would measure the gain error without the need to generate the FS signals by dividing a reference voltage by the gain (VREF/G) is desired. Inventors of embodiments of the present disclosure have discovered a system that may have substantial advantages, such as no need to use an external voltage source or DAC, and less settling time. Such a system may only use the zero measurement (VIN=0) and VIN=VREF voltage instead of the full scale (VREF/G) voltage to measure the gain error, thus reducing the inaccuracy due to the voltage measurement by using the input voltage across all gains. However, using a standard ADC, it is not possible for a gain greater than one to allow an input voltage VIN to be greater than VREF/G (thus VIN*G is greater than VREF). Embodiments of the present disclosure address at least some of these issues and include an ADC that allows an input of VIN=VREF for any given gain G, while still allowing accurate evaluation of the gain error that would be obtained if any given gain G was selected and applied to the ADC.

Figure 2:
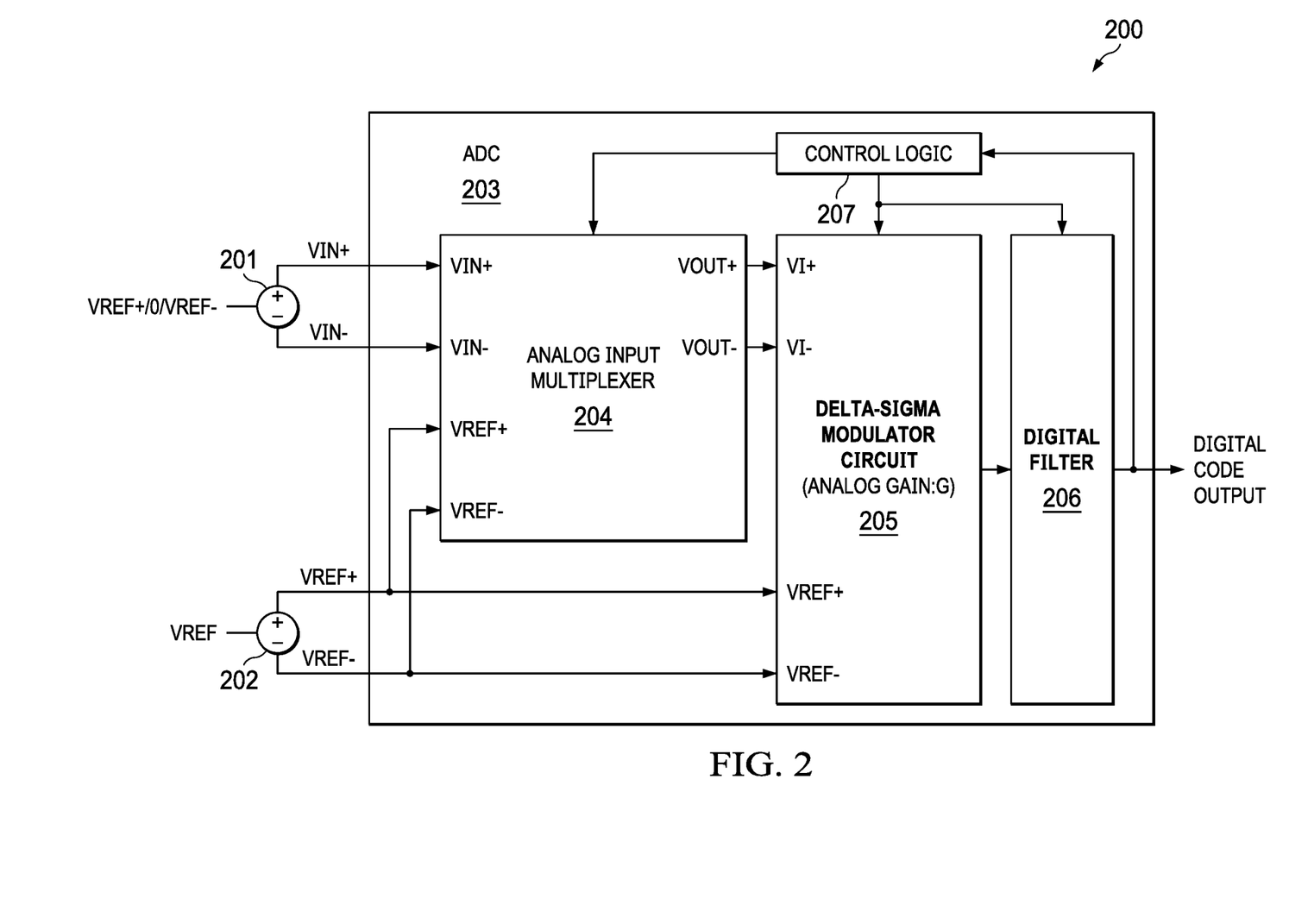
FIG. 2 is an illustration of an example system for ratiometric gain error calibration for ADCs, according to embodiments of the present disclosure.

FIG. 2 is an illustration of an example system 200 for ratiometric gain error calibration for ADCs, according to embodiments of the present disclosure.

System 200 may be applicable or include any suitable ADC, such as ADC 203. ADC 203 may be included in a microcontroller, processor, mobile device, computer, smartphone, tablet, power converter, controller, power supply, sensor, vehicle, or any other suitable electronic device. ADC 203 may be a delta-sigma ADC. Moreover, ADC 203 may include a capacitive gain input stage. System 200 may be configured to determine gain errors in ADC 203. Moreover, system 200 may be configured to calibrate operation of ADC 203 based upon any determined gain errors, or take any other suitable corrective action.

ADC 203 may include ADC voltage input terminals, such as VIN+ and VIN−. ADC 203 may include ADC reference input terminals, such as VREF+ and VREF−.

ADC 203 may be configured to convert an analog input signal into a digital output code. The analog input signal may be single-ended (not shown, in which case a voltage is accepted as input and the received voltage is compared to ground) or differential, as-shown in FIG. 2. The differential analog input may be the difference in voltage between VIN+ and VIN−, resulting in a total of VIN (VIN=VIN+−VIN−). ADC 203 may be configured to receive a reference voltage. The reference voltage may be single-ended (not shown, in which case a voltage is accepted as reference and the received reference voltage is compared to ground) or differential, as-shown in FIG. 2. The differential analog input may be the difference in voltage between VREF+ and VREF−, resulting in a total of VREF (VREF=VREF+−VREF−). These differential voltages may be attached to a certain common-mode which is not depicted in the figure. The output code may then be a value proportional to VIN/VREF (ADC code=K*VIN/VREF, with K being a constant).

ADC 203 may have a variable, selectable gain whose value is denoted G. This analog gain, G amplifies the input signal VIN internally in ADC 203 so that the voltage converted by ADC 102 is actually G*VIN. In such a case, the transfer function of ADC 203 becomes ADC code=$G*K*VIN/VREF$.

VREF may define the range of voltage input that can be converted by ADC 203. For a single-ended converter, the input voltage range applicable for the A/D conversion may then be [0, VREF]. For a fully-differential converter the input voltage range applicable for the A/D conversion may be [VREF−, VREF+]. When a gain G is applied, the input voltage range of ADC 203 is still the same, but is applied to G*VIN, so that effectively the input voltage range becomes [0, VREF/G] for a single-ended converter and [VREF−/G, VREF+/G] for a fully-differential converter. Outside of this range, the A/D conversions may suffer larger inaccuracies, output code may clip, and overall linearity of the converter may no longer be guaranteed.

ADC 203 may be connected to a voltage source 201. The voltage of voltage source 201 may be chosen between +/−VREF or 0. Voltage source 201 may generate voltages externally to system 200 (with an external voltage source or multiplexer), or internally to system 200. These voltages may be applied through an analog input multiplexer 204. Analog input multiplexer 204 may be implemented in any suitable manner. Analog input multiplexer 204 may be configured to generate VOUT signals (VOUT+−VOUT−) so that VOUT=+/−VREF or 0. VOUT signals may be provided to delta-sigma modulator circuit 205.

ADC 203 may be a delta-sigma ADC, thus including a delta-sigma modulator circuit 205. Delta-sigma modulator circuit 205 may be implemented in any suitable manner, such as by digital circuitry, analog circuitry, instructions for execution by a processor (not shown), or any suitable combination thereof. Delta-sigma modulator circuit 205 may include a stage with the analog gain G to be able to amplify the inputs received on the VI+/VI− input terminals. Delta-sigma modulator circuit 205 may receive reference voltage signals that are routed from the VREF+/− input terminals of ADC 203 without any modifications.

System 100 may include a voltage reference 202. Voltage reference 202 may be implemented in any suitable manner. Voltage reference 202 may generate the reference voltage for system 200. Voltage reference 202 may be internal to ADC 203 (not shown) or external to ADC 203 within system 200. Moreover, voltage reference 202 may be external to system 200.

Delta-sigma modulator circuit 205 may be configured to generate a bitstream based upon its inputs. The voltage inputs (that are to be amplified according to the gain G) of delta-sigma modulator circuit 205 may be given as VI+ and VI−. Delta-sigma modulator circuit 205 may also include inputs for the reference voltage, given as VREF+ and VREF−. The bitstream may be sent to a digital filter 206. Digital filter 206 may be implemented by digital circuitry, analog circuitry, instructions for execution by a processor (not shown), or any suitable combination thereof. Digital filter 260 may be configured to produce a digital output code at the end of a conversion cycle, upon a time increment denoted as TCONV. TCONV may be long enough for delta-sigma modulator circuit 205 to process its inputs to generate a bitstream.

In one embodiment, system 200 may be configured to evaluate the gain error of ADC 203 for any given gain G (G integer) setting, without the need to generate different reference signals such as a +/−VREF/G signal. In another embodiment, system 200 may be configured to evaluate the gain error of ADC 203 without the need of generating any external voltage reference or DAC through use of analog input multiplexer 204 to switch existing voltages at the inputs of the delta-sigma modulator circuit 205.

ADC 203 may include control logic 207. Control logic 207 may be implemented by digital circuitry, analog circuitry, instructions for execution by a processor, or any suitable combination thereof. Control logic 207 may be configured to selectively operate ADC 203 in a calibration phase of operation or in a normal phase of operation. In the calibration phase, inputs of delta-sigma modulator circuit 205 may be controlled so as to operate ADC 203 in a manner that evaluates whether ADC 203 has any gain error and, based upon such a determination, adjust operation of ADC 203 to account for such gain error. In the normal phase, inputs of delta-sigma modulator circuit 205 may be controlled so as to operate ADC 203 in a manner that generates a digital code output based upon inputs from voltage source 201 and reference 202 that reflect analog signals for which system 200 requests an associated digital value. Control logic 207 may be configured to selectively operate one or more of analog input multiplexer 204, delta-sigma modulator circuit 205, and digital filter 206.

During a calibration phase of operation, multiplexer 204 may be configured to route the ADC reference input terminals VREF+/VREF− to the sampling voltage input terminals VI+ and VI− of delta-sigma modulator circuit 205 and sample circuits therein. During a normal phase of operation, multiplexer 204 may be configured to rout the ADC voltage input terminals VIN+/VIN− to the sampling voltage input terminals VI+ and VI− of delta-sigma modulator circuit 205 and sample circuits therein.

Figure 3:
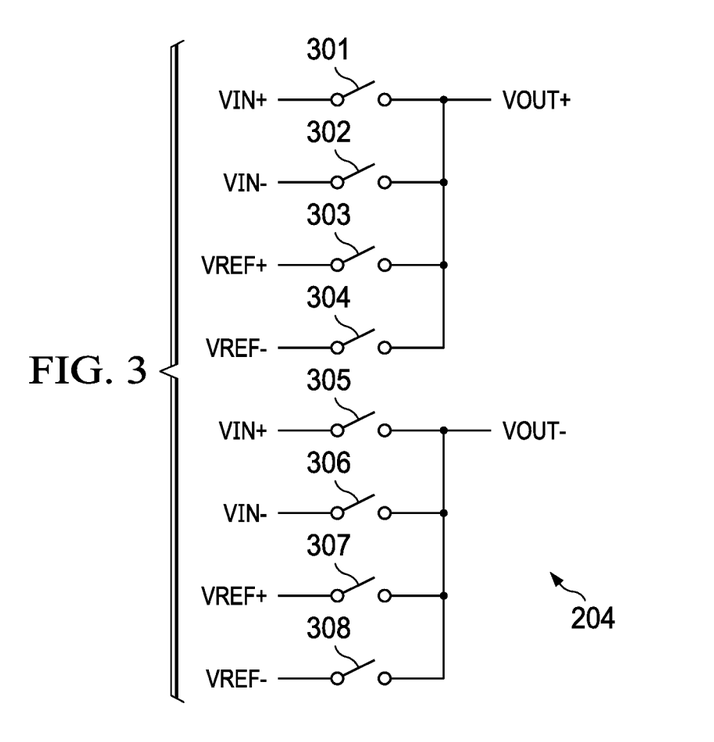
FIG. 3 illustrates an example implementation of an analog input multiplexer, according to embodiments of the present disclosure.

FIG. 3 illustrates an example implementation of analog input multiplexer 204, according to embodiments of the present disclosure. Analog input multiplexer may include eight switches 301-308. Switch 301 may connect VIN+ to VOUT+. Switch 302 may connect VIN− to VOUT+. Switch 303 may connect VREF+ to VOUT+. Switch 304 may connect VREF− to VOUT+. Switch 305 may connect VIN+ to VOUT−. Switch 306 may connect VIN− to VOUT−. Switch 307 may connect VREF+ to VOUT−. Switch 308 may connect VREF− to VOUT−. At any given time, only one of switches 301, 302, 303, 304 might be enabled, the rest being disabled. Similarly, only one of switches 305, 306, 307, 308 may be enabled, the rest being disabled, turned off. The enablement or disablement of switches in FIG. 3 may be performed at the direction of control logic 207 (not shown). This implementation allows generation of the required +/−VREF or zero differential voltages. For a zero measurement, switches 301 and 305 may be enabled, or switches 302 and 306 may be enabled. For a +VREF measurement, switches 303 and 308 may be enabled. For a −VREF measurement, switches 304 and 307 may be enabled. In each of these examples, the remainder of switches may be disabled. Although illustrated as a stand-alone component, analog input multiplexer 104 may be implemented as a specific circuit inside ADC 203, outside ADC 203, or within delta-sigma modulator circuit 205. Analog input multiplexer 204 may also include additional components and be implemented as part of a larger multiplexer, so long as analog input multiplexer 204 can connect VOUT to +/−VREF or 0 during the whole time of the A/D conversion.

Figure 4:
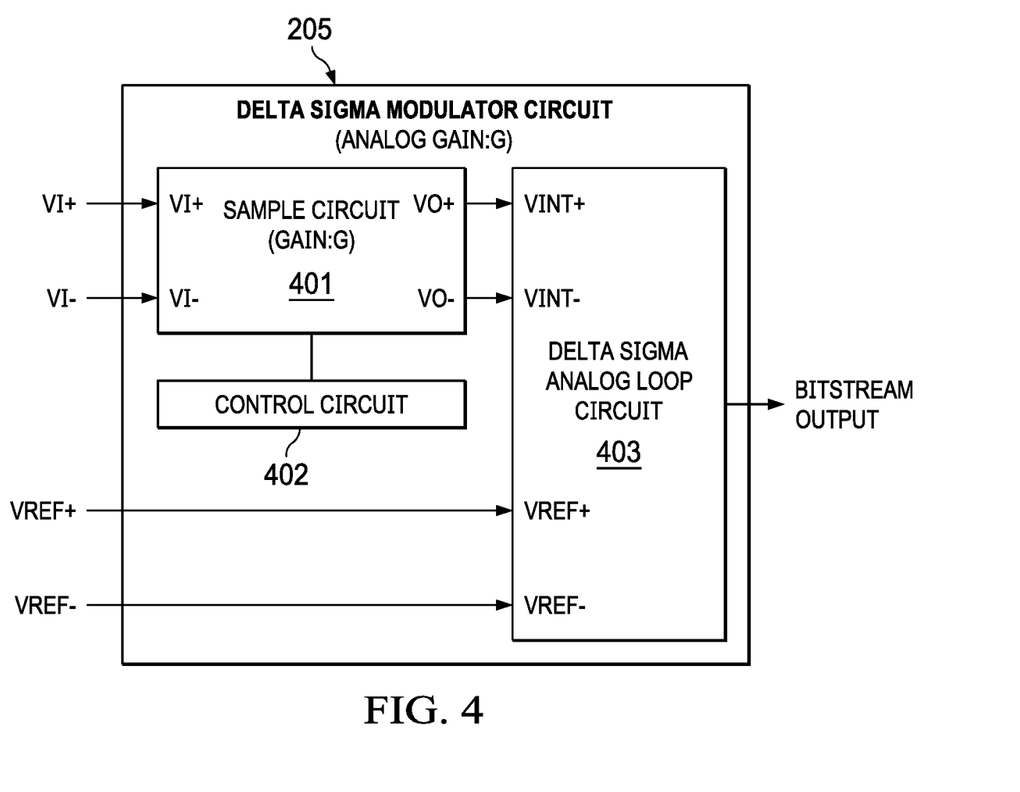
FIG. 4 is an illustration of an example implementation of a delta-sigma modulator circuit, according to embodiments of the present disclosure.

FIG. 4 is an illustration of an example implementation of delta-sigma modulator circuit 205, according to embodiments of the present disclosure.

Delta-sigma modulator circuit 205 may include a sample circuit 401, a control circuit 402, and a delta-sigma analog loop circuit 403. Sample circuit 401, control circuit 402, and delta-sigma analog loop circuit 403 may be implemented by analog circuitry, digital circuitry, instructions for execution by a processor (not shown), or any suitable combination thereof.

Sample circuit 401 may include sampling voltage input terminals VI+ and VI−. Sample circuit 401 may be configured to sample the input voltages on VI+ and VI−. Furthermore, sample circuit 401 may be configured to apply a gain, G, to the input voltage signals and output these on sampling voltage output terminals VO+ and VO−. Sample circuit 401 may be configured to operate based upon commands or signals from control circuit 402. Control circuit 402 may further receive commands or signals from control logic 207 (not shown). Delta-sigma analog loop circuit 403 may be configured to generate the output bitstream that will feed digital filter 206 in ADC 203. The reference input signals of VREF+ and VREF− may be routed with no modifications to delta-sigma analog loop input circuit 403 reference pins, also given as VREF+ and VREF−.

Figure 5:
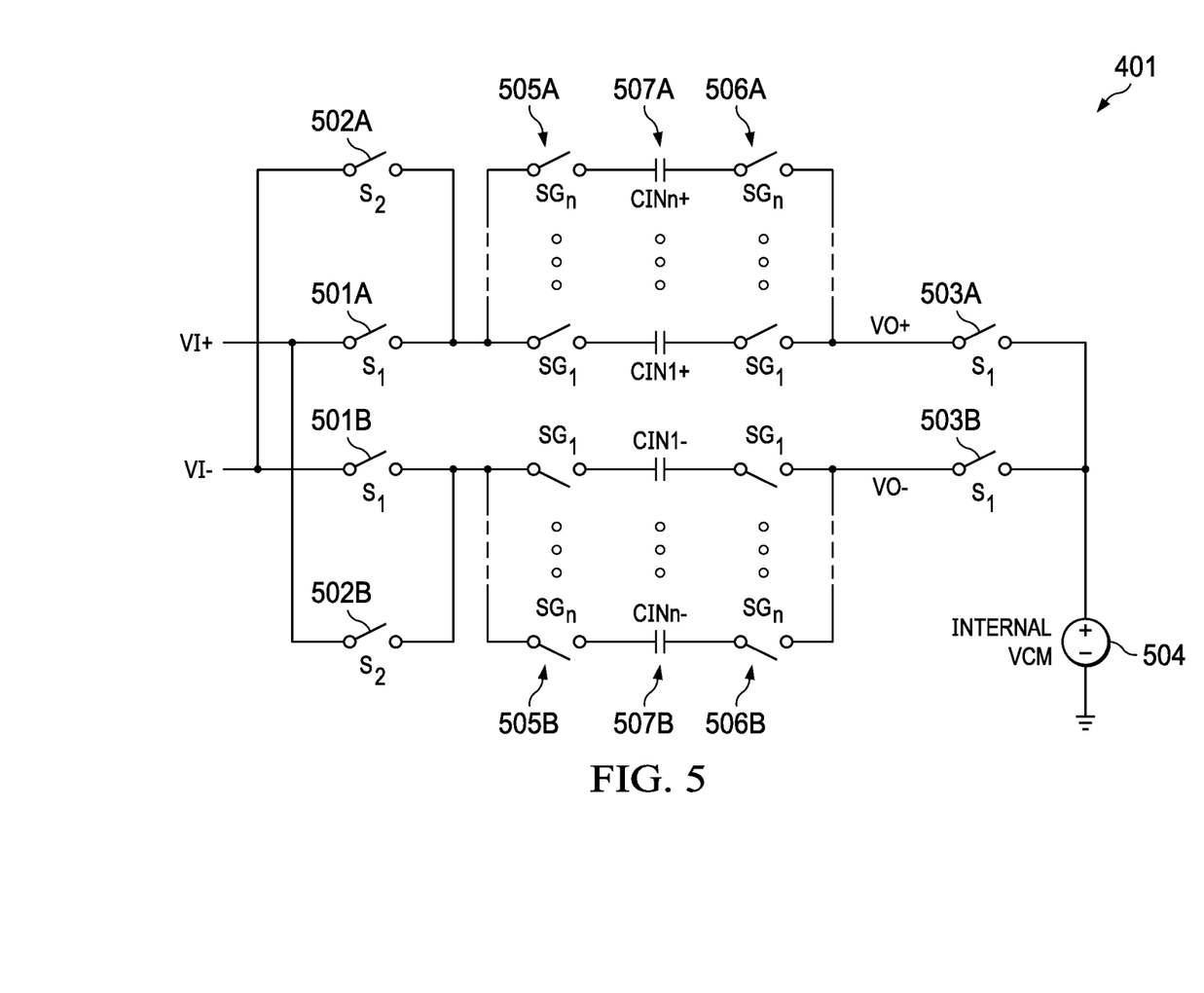
FIG. 5 illustrates an example implementation of a sample circuit, according to embodiments of the present disclosure.

FIG. 5 illustrates an example implementation of sample circuit 401, according to embodiments of the present disclosure. In one embodiment, as shown in FIG. 5, sample circuit 401 may be implemented in a fully-differential manner. A single-ended implementation may be used wherein VI− is connected to ground.

Sample circuit 401 may have two pairs of input switches 501, 502. Input switches 501, 502 may be connected to the inputs VI+/− in a cross implementation, wherein VI+ is connected to switches 501A, 502B, and VI− is connected to switches 502A, 501B. Switches 501 may be controlled by a first switch control signal S1. Switches 502 may be controlled by a second switch control signal S2. Switches 501A, 502A may be connected to a capacitor array 507A. Switches 501B, 502B may be connected to a capacitor array 507B. Capacitor arrays 507 may be implemented by capacitors connected in parallel and configured to be selectively enabled or disabled. Capacitor arrays 507 may be configured to be arranged between the sampling input voltage terminals VI+ and VI− and the sampling output voltage terminals VO+ and VO−.

Capacitor array 507A may include a series of input switches 505A and a series of output switches 506A configured to select which capacitance from capacitor array 507A will be connected to input switches 501A, 502A. Similarly, capacitor array 507B may include a series of input switches 505B and a series of output switches 506B configured to select which capacitance from capacitor array 507B will be connected to input switches 501B, 502B. Each capacitor array 507 may include a maximum of n pairs of capacitors of the same, matched values, the capacitors named respectively $CIN_{1...n}+$ in capacitor array 507A and $CIN_{1...n}-$ in capacitor array 507B. Switches 505, 506 may be controlled by the commands $SG_{1...n}$, applied to both capacitor arrays 507 so that a given enabling command $SG_k$ can enable the capacitors $CIN_k+/-$ to sample the input signal routed by the switches 501, 502. Switches 501, 502 might not be enabled at the same time. Switch commands S1 and S2 applied to switches 501, 502 respectively may be clocked on two different phases of the same clock in a non-overlapped manner. Switches 503A, 503B may be configured to connect one of the plates of each of the $CIN_{1...n}+/-$ capacitors to an internal common-mode voltage (VCM) through a voltage source 504. This VCM could also be generated externally. If all capacitors are matched and if only G pairs of capacitors are effectively connected through switches 505, 506, the gain of the system would be G times larger than if only one pair of capacitors was connected though one pair of switches 505, 506. Thus, sample circuit 401 effectively realizes an analog gain of G while sampling the input signals present at the inputs VI+/−. The sampled charge on capacitor arrays 507 would be G times larger if G capacitors are selected than if only one capacitor is selected to sample the VI+ and VI− input signals. The VO+/− outputs can then be sent to delta-sigma loop circuit 403, which may be configured to evaluate the amount of charge that has been stored on the sample circuit within the capacitor arrays 507 and therefore produce a bitstream which will be filtered by the digital filter 206 to give the output code of the ADC 203. Other sources of gain error may be inherent to delta-sigma analog loop circuit 403, delta-sigma modulator circuit 205, or digital filter 206. However, these errors might not depend upon the gain G and may this be disregarded for simplicity of the description of the present disclosure.

The gain G realized by sample circuit 401 is subject to inaccuracies in its implementation such as capacitor mismatch between the $CIN_{1...n}+/-$ capacitors. The gain can also be affected by parasitic capacitors used to implement switches 505, 506. Thus, such switches should be made small enough that the additional capacitance is negligible compared to the unit capacitance of each $CIN_{1...n}+/-$. Switches 505, 506 should also be implemented such that the leakage current passing through them is negligible when they are in their disabled state. Since ADC 203 is a delta-sigma converter, delta-sigma analog loop circuit 403 may contain integrator circuits, and thus any leakage current from sample circuit 401 may be integrated in the loop leading to potentially large inaccuracies. This leakage current impact can be minimized with proper switch implementation techniques and with faster conversion times. These inaccuracies are taken into account in the gain error measurement system depicted here. The maximum gain of sample circuit 401 is determined by the amount of pair capacitors in each array 507. In this example, the maximum is n. The source of the gain error of ADC 203 at each gain is mainly in sample circuit 401 because of capacitor mismatches and switch inaccuracies.

During the calibration phase of operation, control circuit 402 and control logic 207 may be configured to issue switch signals to switches 501, 502, 503, 505, 506. Such switch signals are shown in more detail in timing diagrams further below. Control logic 207 may be configured to operate multiplexer 204 to route the reference voltage input (VREF) of ADC circuit 200 to the VI+/− inputs of sample circuit 401 during the calibration phase of operation. Control circuit 402 and control logic 207 may be configured to determine what gain value is to be tested. The determination of what gain value to test may be performed on any suitable basis, such as by a command to ADC circuit 200, register values, settings, or any other suitable input. Moreover, the possible gain values of ADC circuit 200 may be successively tested. Based on the gain value to be tested, control circuit 402 and control logic 207 may be configured to determine which subsets of capacitors 507 are associated with the gain value. The subsets may be defined in terms of pairs of capacitors. The determination of which subsets of capacitors 507 that are associated with the gain value may be made in any suitable manner, such as by reference to user commands, settings, or register values. Based upon which subsets of capacitors 507 that are associated with the gain value, each subset in turn may be enabled for a determined number of samples while the remainder of the other subsets and capacitors 507 are disabled. This may be performed using control signals issued to switches 501, 502, 503, 505, 506, shown in more detail further below. The process may be repeated for each subset of capacitors 507 that are associated with the gain value. During the enabling of each subset of capacitors 507, ADC circuit 200 and sample circuit 401 may have an effective gain of one. Each subset of capacitors 507 may be enabled for a same number of samples. After all subsets of capacitors 507 that are associated with the gain value have been enabled, the values stored in capacitors 507 may be integrated by delta-sigma analog loop circuit 403, which may generate an output code in the form of a bitstream. Control logic 207 may be configured to take corrective action based on the gain error based determined from the output code to correct for the gain error. Control logic 207 may determine another gain value of ADC circuit 200 for which ADC circuit 200 is to be calibrated, determine another set of capacitors 507 used to achieve this other gain value, successively enable subsets of the set of capacitors 507 while disabling the remainder of capacitors 507, determining another output code that has resulted from enabling all of capacitors 507 from the other set, and, from the other output code, determine another gain error of the other gain value of ADC circuit 200. Control logic 207 may be configured to cause sampling of each subset of the set of capacitors 507 for a subset of a total number of samples. The total number of samples may be performed across all subsets for a given gain value. The total number of samples taken for the given gain value divided by the given gain value is the number of samples in each subset of the total number of samples. The total number of samples divided by the gain value might have no remainders.

Figure 6:
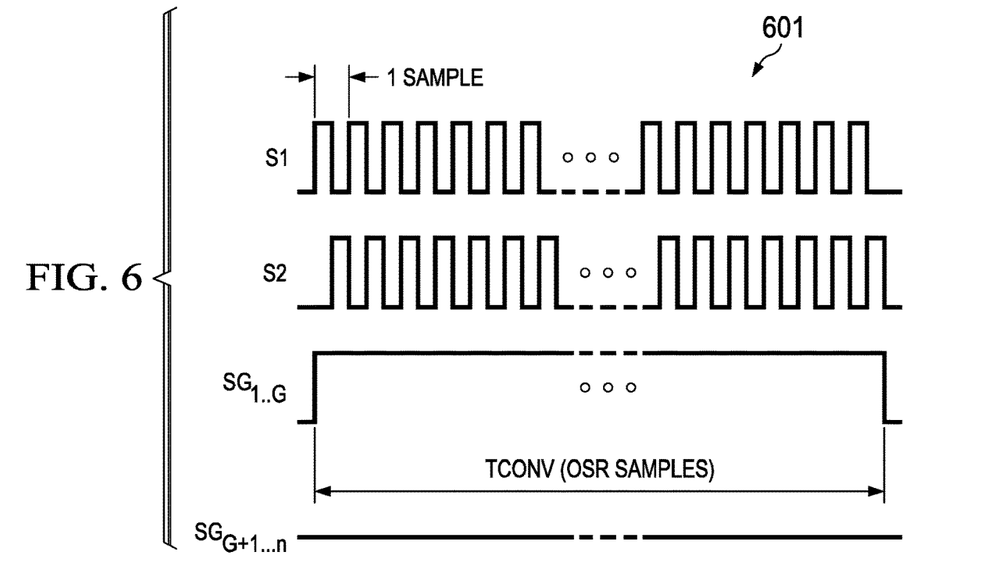
FIG. 6 illustrates a timing diagram to be applied and generated by a control circuit to the sample circuit, according to embodiments of the present disclosure.

FIG. 6 illustrates a timing diagram to be applied and generated by control circuit 402 to sample circuit 401, according to embodiments of the present disclosure. The timing diagram of FIG. 6 describes the switches commands S1, S2 and $SG_{1 \ldots n}$ during a standard conversion in normal phase for a given setting value of the analog gain G for ADC 203. With this timing diagram, the voltage converted at the inputs VIN+/− of the VIN terminals of ADC 203 is amplified by G within sample circuit 401 when converted from voltage to charge through use of the capacitor arrays 507.

In FIG. 6, the timing diagram illustrates one conversion cycle whose total time is TCONV. One conversion may be split into multiple samples. A requisite number of samples may be an oversampling ratio (OSR). Each sample is clocked with a constant sample time taken at the sample frequency fs. Therefore, $$TCONV=OSR/fs.$$

In order to realize the gain G, control circuit 402 may have to generate control signals for the $SG_{1 \ldots n}$ switches. Out of the n pair of capacitors in capacitor arrays 507, only a number G should be selected to realize the gain G. The specific capacitors of the n capacitors may be chosen arbitrarily, but as the gain error depends heavily on capacitor mismatch, control circuit 402 should always select the same capacitor pairs to yield a repeatable gain error at every conversion, so that this gain error can be accounted for. Since the order of selecting capacitors is not important, the example shown in FIG. 6 has the first $SG_{1 \ldots G}$ capacitor pairs selected. These capacitor pairs are selected by enabling respective ones of switches 505, 506. In FIG. 6, the $SG_{1 \ldots G}$ timing diagrams show the logic signal to be high during the total conversion period (wherein logic-high enables the switches in the chosen convention of FIG. 6). The other switches $SG_{G+1 \ldots n}$ are disabled (logic-low during the entire conversion period), so that no charge is sampled on these capacitors during the conversion.

During each sample, the S and S2 signals that control switches 501, 502, 503 represent two phases of the same clock running at fs frequency. These signals are not logic-high at the same time in order to avoid any short circuits. During the S1 phase (when S2 is logic low and S1 is logic high), switches 501, 503 are enabled, and therefore the input voltages VI+ and VI− are sampled on the capacitors $CIN_{1 \ldots G}$+/−. During this time, the input voltage is converted into a charge stored in the capacitor arrays 507. If all capacitors were matched and if their value was equal to C, then the sum of the charges stored on the $CIN_{1 \ldots G}$+ capacitors would be equal to G*C*(VI+−VCM). Similarly, the sum of the charges stored on the $CIN_{1 \ldots G}$− capacitors would be equal to G*C*(VI−−VCM). Thus, the total difference of charge between the capacitors would be $$Q=G*C*(VI+-VI-).$$

If each capacitor was equal to $CIN_k$ and thus equal to $C*e_k$ (factoring an error factor, $e_k$, for each capacitor), then this total would be $$Q=C*\Sigma\{(e_k)*(VI+-VI-)\}.$$

Here, the capacitors have been defined as equal for simplicity between $CIN_k$+ and $CIN_k$− as their mismatch between positive and negative would result in a common-mode change that would be filtered by the fully differential nature of the converter. The gain error would be $$GERR=\Sigma\{(e_k)/G-1\}.$$

This gain error is due to mismatch of the capacitors and includes the parasitic effects of each capacitor in switches 505, 506. This gain error is the ADC gain error that is due to sample circuit 401. ADC 203 may have other sources of gain error, but these might not be dependent on the gain selection and are inherent to other portions of system 200. Thus, these other sources of gain error should remain constant when the gain selection varies, and thus may be ignored for the purposes of gain error measurement as they will have no effect thereupon.

In the S2 phase (when S2 is logic high and S1 is logic low), the terminals VO+ and VO− are typically connected to a virtual ground (such as inputs of an op-amp) so that the charge stored on the capacitors can be transferred to the rest of the circuit to be integrated in delta-sigma analog loop circuit 403. In this example, switches 502 are enabled and switches 501, 503 are disabled. By connecting switches 502 to the opposite inputs (compared to switches 501), another sampling of the VI+/− inputs is performed, synchronous with the charge transfer realized in the S2 phase. This additional sampling does not change the gain error but has the effect of multiplying the gain of the sample circuit by two, and therefore it improves the signal to noise ratio of the sampling and transfer event for each sample time. The total charge during S1, S2 phases is then given as $$Qtot=2*C*\Sigma(e_k)*(VI+-VI-).$$

In one embodiment, sample circuit 401 may be used in a configuration where the gain would be 1 instead of G, but in which the gain error would be substantially equal to the gain error estimated when the gain is G, as depicted in FIG. 6. In one embodiment, no modification of sample circuit 401 may be needed to accomplish a scenario wherein the gain is 1 but in which the gain error is substantially equal to the gain error estimated with the gain is G. Instead, modification of the controls of switches 505, 506 may be used as discussed below.

Figure 7:
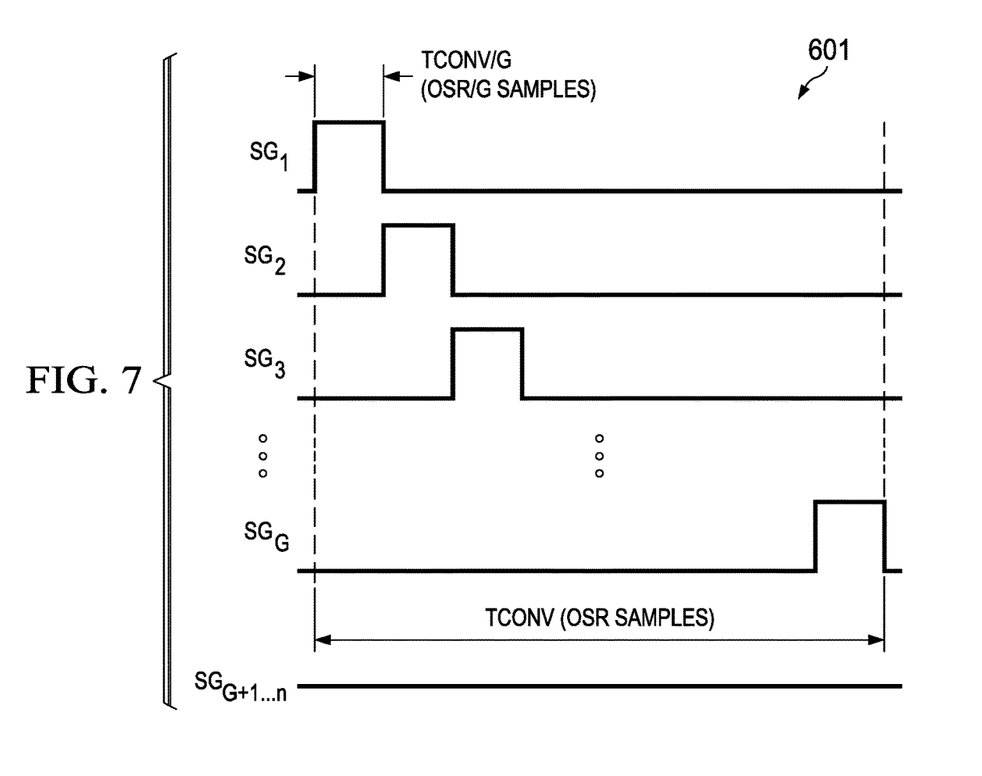
FIG. 7 describes another timing diagram to be applied to a sample circuit, in accordance with embodiments of the present disclosure

FIG. 7 describes another timing diagram to be applied to sample circuit 401, in accordance with embodiments of the present disclosure. The timing diagram of FIG. 7 may realize the same gain error as realized by the timing diagram of FIG. 6, but the timing diagram of FIG. 7 may define this same gain error instead with a gain of 1 when applied to sample circuit 401.

In FIG. 7, the signals S1 and S2 are identical to the signals S and S2 in FIG. 6. The sampling events are clocked at the same time. The signals $SG_{G+1 \ldots n}$ are also similar to FIG. 6 in that the pairs of capacitors $CIN_{G+1 \ldots n}$ remain unselected during the conversion period. Since these signals are the same, they are not shown in FIG. 7.

The timing diagram of FIG. 7 may realize the gain error for different gain settings while only using a gain of one through use of the signals $SG_{1 \ldots G}$. In FIG. 7, at each sample, only one of the $SG_{1 \ldots G}$ is enabled at the same time. If all the capacitors were matched, the charge stored on each phase by the sample circuit would then be equal to $Q=C*(VI+-VI-)$, resulting in a gain of one. This contrasts with the timing diagram of FIG. 6, wherein the charge stored was $Q=G*C*(VI+-VI-)$. When the capacitors have a mismatch defined by $CIN_k=C*e_k$, the charge sampled on the $CIN_k+/-$ pair of capacitors at each sample would then be $$Q_k=2*e_k*C*(VI+-VI-).$$

The factor of 2 arises from the double sampling realized with S1 and S2 phases.

Each of the signals $SG_{1 \ldots G}$ is enabled during a quantity of OSR/G samples. This imposes a condition on G and OSR, wherein OSR should be a multiple of G. Control circuit 402 may be configured to define an OSR such that OSR is a multiple of G. Furthermore, digital filter 206 may be configured to generate the desired decimation with OSR samples where OSR is a multiple of G.

Delta-sigma analog loop circuit 403 may be configured to perform an integration resulting in averaging of each sample. As a result, the conversion output code is proportional to the total sum of the charges sampled during the conversion period. This average charge can be evaluated if each $CIN_k$ is selected during OSR/G samples and, when a given $CIN_k$ is selected, no other capacitor is selected. This is accomplished in the timing signals of $SG_{1 \ldots G}$ in FIG. 7. Such an average charge may be given as Q=Σ{(total charge during each sample)/OSR}. If the total charge sampled on the input capacitors $(Q_{ktot}=2*C*e_k*(VI+-VI-))$ is replaced for OSR/G samples, then the result may be $$Q=2*C*(VI+-VI-)*\Sigma\{(e_k)/G\}.$$

Given this resulting charge, the gain error made using the timing diagram of FIG. 7 compared to an ideal gain of 1 would be equal to $$GERR=\Sigma\{(e_k)/G-1\}$$

which is equal to the gain error calculated with applying the timing diagram of FIG. 6 to sample circuit 401, but wherein the timing diagram of FIG. 7 uses a gain of one instead of a gain of G used by the timing diagram of FIG. 6.

The timing diagram of FIG. 7 can thus be used with signals at the differential inputs as large as VREF. This may be performed without large inaccuracies due to the saturation of ADC 203 because of a voltage that is too large for the defined input voltage range. When the effective gain is 1, the range of the converter is [−VREF, +VREF]. Therefore, when applying +VREF to the VIN input of ADC 203, and when using the control signals of the timing diagram of FIG. 7 on sample circuit 401 through control block 402, the gain error is essentially the same as when the control signals of the timing diagram of FIG. 6 are applied. The converter code output resulting from the timing diagram of FIG. 7 is equivalent to the converter code output when the ADC gain is G with an input of +FS which may be defined as +VREF/G. A gain error calibration can then be made for the gain G with the timing diagram of FIG. 7 without applying different input voltages, as long as the conversion includes OSR samples and OSR is a multiple of G.

As VREF can be applied at the inputs of ADC 203 for any given gain G (as long as G is a divider of OSR), and since the timing diagram of FIG. 7 results in gain error of ADC 203 while realizing an effective gain of 1, gain calibrations may be performed sequentially for any given sequence of gains G1 . . . Gm without the need of additional settling times at inputs of ADC 203. Thus, the calibration process of all selected gains G1 . . . Gm may be faster. Control logic 207 may be configured to iterate through all available, selectable gain settings G1 . . . Gm of ADC 203 to evaluate the gain error for each such gain setting.

In the timing diagram of FIG. 7, the $SG_{1 \ldots G}$ signals may be enabled in any order. This may result from the averaging of the charge stored performed by sample circuit 401. Any such order may be used as long as for each given sample, only one of the $SG_{1 \ldots G}$ signals is enabling switches for the respective capacitors while all signals are disabling switches for the other capacitors. Moreover, any such order may be used as long as each of the $SG_{1 \ldots G}$ signals enable switches for the respective capacitors for the same amount of samples (equal to OSR/G). The order of the sampling does not change the effective gain of the conversion which stays equal to 1.

Embodiments of the present disclosure might not require any additional voltage source beyond VREF to perform gain error calibration for different gain values. Embodiments of the present disclosure might not require VREF to be precisely generated. VREF is applied to both inputs of delta-sigma analog loop circuit 403, and thus the solution of determining gain error may be said to be ratiometric. Moreover, embodiments of the present disclosure might not require a precision voltage source or equipment to measure gain error. Embodiments of the present disclosure may utilize any available direct current voltage with sufficiently low noise as VREF. Generation of a precise value of VREF/G, as performed in other solutions for testing gain error, might be unnecessary. In addition, as VREF is used as VIN input during calibration, any noise or other non-ideality arising from the generation of VREF may be cancelled through the ratiometric measurement. Furthermore, calibration may be performed without waiting for settling time of inputs in between conversions.

Once gain error has been determined for a given gain value, ADC 203 may be configured to take any suitable corrective action. For example, ADC 203 may be configured to selectively apply a compensation signal to future measurements in the normal operation phase made with the given gain value.

Figure 8:
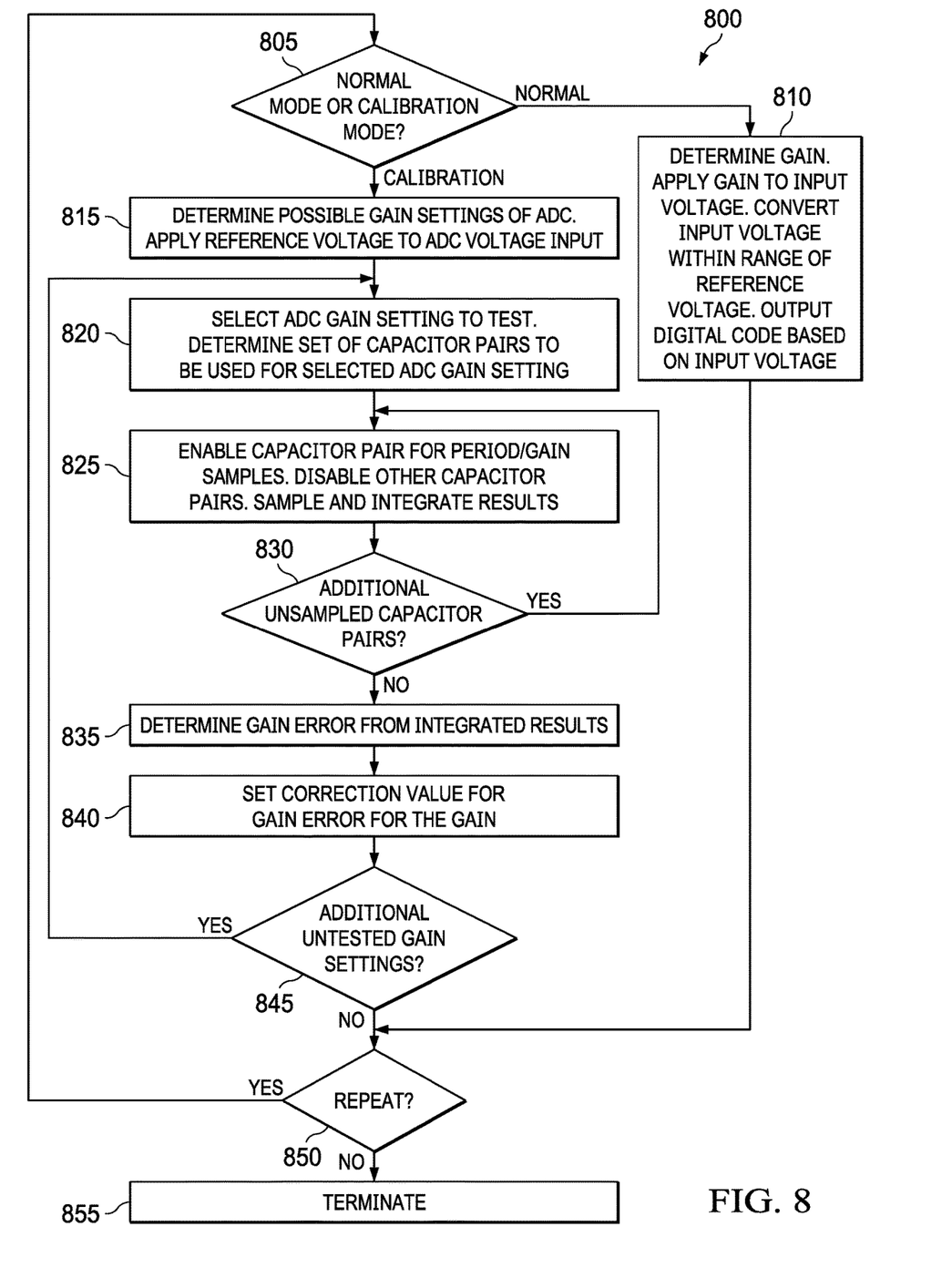
FIG. 8 is an illustration of an example method for determining ratiometric gain error for ADCs with capacitive gain input stages, according to embodiments of the present disclosure.

FIG. 8 is an example method 800 for determining ratiometric gain error for ADCs with capacitive gain input stages, according to embodiments of the present disclosure. Method 800 may include more or fewer steps that those shown in FIG. 8. Moreover, various steps of method 800 may be omitted, repeated, performed in parallel, performed in a different order, or performed recursively. Method 800 may be implemented by elements of FIGS. 2-5 using timing diagrams shown in FIG. 7. In particular, method 800 may be performed, directly or indirectly, by control logic 207.

At step 805, it may be determined whether to operate the ADC in a normal phase or in a calibration phase. If the ADC is to be operated in a normal phase, method 800 may proceed to step 810. Otherwise, method 800 may proceed to step 815.

At step 810, a gain to be used in the ADC may be determined. The gain may be applied to an input voltage that is to be converted to a digital value. After applying the gain, the input voltage may be converted within a range defined by a reference voltage range of the ADC. A digital code may be output from the ADC that is based upon the input voltage. Method 800 may proceed to step 850.

At step 815, the different possible gain settings of the ADC may be determined. Furthermore, the reference voltage of the ADC may be applied to the ADC voltage input.

At step 820, an untested ADC gain setting may be selected for test. A set of capacitor pairs that are to be used for the selected ADC gain setting may be determined.

At step 825, a subset of the capacitor pairs, such as a single capacitor pair, may be enabled. The capacitor pair may be enabled for a length of time sufficient to capture a quantity of samples defined by the sample period divided by the gain. While the capacitor pair is enabled, the other capacitors may be disabled. At the end of the sample period, the results may be integrated.

At step 830, it may be determined whether there are additional unsampled capacitor pairs from the determined set of capacitor pairs from step 820. If so, method 800 may repeat at, for example, step 825. Otherwise, method 800 may proceed to step 835.

At step 835, gain error may be determined from the integrated results for the selected gain setting. At step 840, a correction value for gain error for the gain may be set for future operation in normal phase.

At step 845, it may be determined whether there are additional gain settings that are untested. If so, method 800 may repeat at, for example, step 820. Otherwise, method 800 may proceed to step 850.

At step 850, it may be determined whether method 800 is to repeat. Method 800 may repeat based upon any suitable criteria, such as whether a larger device or system in which the ADC is implemented has commanded the ADC to continue operating or to halt. If method 800 is to repeat, method 800 may return to, for example, step 805. Otherwise, method 800 may terminate at step 855.

The present disclosure has been described in terms of one or more embodiments, and it should be appreciated that many equivalents, alternatives, variations, and modifications, aside from those expressly stated, are possible and within the scope of the disclosure. While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

What is claimed is:

1. An analog to digital converter (ADC) circuit, comprising:
    an ADC voltage input terminal;
    an ADC reference input terminal;
    a sample circuit including:
        a sampling voltage input terminal;
        a sampling voltage output terminal; and
        a plurality of capacitors connected in parallel configured to be selectively enabled or disabled, the plurality of capacitors arranged between the sampling voltage input terminal and the sampling voltage output terminal;
    a multiplexer connected between the ADC voltage input terminal and the sampling voltage input terminal and between the ADC reference input terminal and the sampling voltage input terminal; and
    control logic configured to, in a calibration phase of operation:
        cause the multiplexer to route the ADC reference input terminal to the sampling voltage input terminal;
        determine a given gain value of the ADC circuit for which gain error is to be calibrated;
        determine a set of the plurality of capacitors in the sample circuit to be used to achieve the given gain value;
        successively enable capacitor subsets of the set of the plurality of capacitors to sample voltage of the ADC reference input terminal at the sampling voltage input terminal while disabling a remainder of the capacitors of the set of the plurality of capacitors until all capacitors of the set of the plurality of capacitors have been enabled;
        determine an output code resulting after enabling all capacitors of the set of the plurality of capacitors; and
        from the output code, determine a gain error of the given gain value of the ADC circuit;
    wherein the control logic is further configured to take corrective action based upon the gain error of the given gain value of the ADC circuit.

2. The ADC circuit of claim 1, wherein enabling each subset of the set of the plurality of capacitors is configured to set the ADC circuit to perform a gain of one.

3. The ADC circuit of claim 1, wherein each subset of the set of the plurality of capacitors is enabled for a same number of samples.

4. The ADC circuit of claim 1, wherein the control logic is further configured to, in the calibration phase of operation:
    determine another gain value of the ADC circuit for which gain error is to be calibrated;
    determine another set of the plurality of capacitors in the sample circuit to be used to achieve the other gain value;
    successively enable capacitor subsets of the other set of the plurality of capacitors to sample voltage of the ADC reference input terminal at the sampling voltage input terminal while disabling a remainder of the capacitors of the other set of the plurality of capacitors until all capacitors of the other set of the plurality of capacitors have been enabled;
    determine another output code resulting after enabling all capacitors of the other set of the plurality of capacitors; and
    from the other output code, determine a gain error of the other gain value of the ADC circuit.

5. The ADC circuit of claim 1, wherein the control logic is further configured to:
- cause sampling of voltage of the ADC reference input terminal at the sampling voltage input terminal for a given number of samples; and
- cause sampling of each subset of the set of the plurality of capacitors for a subset of the given number of samples, the subset of the given number of samples equal to the given number of samples divided by the given gain value.

6. The ADC circuit of claim 5, wherein a quotient of the given number of samples divided by the given gain value has no remainders.

7. A system, including:
- a reference voltage source;
- an analog to digital converter (ADC) circuit, comprising:
  - an ADC voltage input terminal;
  - an ADC reference input terminal connected to the reference voltage source;
  - a sample circuit including:
    - a sampling voltage input terminal;
    - a sampling voltage output terminal; and
    - a plurality of capacitors connected in parallel configured to be selectively enabled or disabled, the plurality of capacitors arranged between the sampling voltage input terminal and the sampling voltage output terminal;
  - a multiplexer connected between the ADC voltage input terminal and the sampling voltage input terminal and between the ADC reference input terminal and the sampling voltage input terminal; and
  - control logic configured to, in a calibration phase of operation:
    - cause the multiplexer to route the ADC reference input terminal to the sampling voltage input terminal;
    - determine a given gain value of the ADC circuit for which gain error is to be calibrated;
    - determine a set of the plurality of capacitors in the sample circuit to be used to achieve the given gain value;
    - successively enable capacitor subsets of the set of the plurality of capacitors to sample voltage of the reference voltage source while disabling a remainder of the capacitors of the set of the plurality of capacitors until all capacitors of the set of the plurality of capacitors have been enabled;
    - determine an output code resulting after enabling all capacitors of the set of the plurality of capacitors; and
    - from the output code, determine a gain error of the given gain value of the ADC circuit;
  - wherein the control logic is further configured to take corrective action based upon the gain error of the given gain value of the ADC circuit.

8. The system of claim 7, wherein enabling each subset of the set of the plurality of capacitors is configured to set the ADC circuit to perform a gain of one.

9. The system of claim 7, wherein each subset of the set of the plurality of capacitors is enabled for a same number of samples.

10. The system of claim 7, wherein the control logic is further configured to, in the calibration phase of operation:
- determine another gain value of the ADC circuit for which gain error is to be calibrated;
- determine another set of the plurality of capacitors in the sample circuit to be used to achieve the other gain value;
- successively enable capacitor subsets of the other set of the plurality of capacitors to sample voltage of the ADC reference input terminal at the sampling voltage input terminal while disabling a remainder of the capacitors of the other set of the plurality of capacitors until all capacitors of the other set of the plurality of capacitors have been enabled;
- determine another output code resulting after enabling all capacitors of the other set of the plurality of capacitors; and
- from the other output code, determine a gain error of the other gain value of the ADC circuit.

11. The system of claim 7, wherein the control logic is further configured to:
- cause sampling of voltage of the ADC reference input terminal at the sampling voltage input terminal for a given number of samples; and
- cause sampling of each subset of the set of the plurality of capacitors for a subset of the given number of samples, the subset of the given number of samples equal to the given number of samples divided by the given gain value.

12. The system of claim 11, wherein a quotient of the given number of samples divided by the given gain value has no remainders.

13. A method, comprising:
- routing an analog to digital converter (ADC) reference input terminal of an ADC to a sampling voltage input terminal of a sample circuit in the ADC;
- determining a given gain value of the ADC for which gain error is to be calibrated;
- determining a set of a plurality of capacitors in a sample circuit of the ADC to be used to achieve the given gain value, the plurality of capacitors connected in parallel and configured to be selectively enabled or disabled;
- successively enabling capacitor subsets of the set of the plurality of capacitors to sample voltage of the ADC reference input terminal while disabling a remainder of the capacitors of the set of the plurality of capacitors until all capacitors of the set of the plurality of capacitors have been enabled;
- determining an output code resulting after enabling all capacitors of the set of the plurality of capacitors;
- from the output code, determining a gain error of the given gain value of the ADC;
- taking corrective action based upon the gain error of the given gain value of the ADC;
- determining another gain value of the ADC for which gain error is to be calibrated;
- determining another set of the plurality of capacitors to be used to achieve the other gain value;
- successively enabling capacitor subsets of the other set of the plurality of capacitors to sample voltage of the ADC reference input terminal while disabling a remainder of the capacitors of the other set of the plurality of capacitors until all capacitors of the other set of the plurality of capacitors have been enabled;
- determining another output code resulting after enabling all capacitors of the other set of the plurality of capacitors; and
- from the other output code, determining a gain error of the other gain value of the ADC.

14. The method of claim 13, wherein enabling each subset of the set of the plurality of capacitors will set the ADC to perform a gain of one.

15. The method of claim 13, wherein each subset of the set of the plurality of capacitors is enabled for a same number of samples.

16. The method of claim 13, further comprising to:
   sampling a voltage of the ADC reference input terminal at the sampling voltage input terminal for a given number of samples; and
   sampling of each subset of the set of the plurality of capacitors for a subset of the given number of samples, the subset of the given number of samples equal to the given number of samples divided by the given gain value.

17. The method of claim 16, wherein a quotient of the given number of samples divided by the given gain value has no remainders.

\* \* \* \* \*